April 16, 1968 J. G. NORDAHL 3,378,785

NINETY-DEGREE AMPLIFIER PHASE SHIFT

Filed Nov. 2, 1964

John G. Nordahl
INVENTOR.

BY Michael P. Breston

ATTORNEY

United States Patent Office 3,378,785

Patented Apr. 16, 1968

3,378,785

NINETY-DEGREE AMPLIFIER PHASE SHIFT CIRCUIT

John G. Nordahl, Lexington, Mass., assignor to Weston Instruments, Inc., a corporation of Texas Filed Nov. 2, 1964, Ser. No. 408,028
3 Claims. (Cl. 330—107)

ABSTRACT OF THE DISCLOSURE

A circuit is provided for shifting the input signals received at the circuit input terminal by exactly 90 degrees. The circuit includes an amplifier having a high negative gain and respective input and output terminals. The amplifier input terminal is connected to the circuit input terminal via a resistor to receive the input signals from the circuit input terminal. A feedback circuit couples the amplifier output terminal to the amplifier input terminal and includes first and second series-connected parallel circuits, each parallel circuit having a resistor and a capacitor connected in parallel relationship. The resistance-capacitance product value of one parallel circuit is equal to the resistance-capacitance value of the other parallel circuit, this relationship being readily effected by having the resistors and capacitors comprising the parallel circuits of respective equal values. A resistor connects the junction common to both parallel circuits to constant level of potential, for example, ground potential, and preferably has a resistance value equal to one-half that of a resistor in one of the parallel circuits.

This invention relates to phase-shifting circuits and, more particularly, to phase-shifting circuits employing operational amplifiers to provide a ninety-degree phase shift over a relatively wide frequency band.

It is well known that a high-gain, direct-current amplifier, often referred to as an operational amplifier, with a resistive input nad a capacitive feedback between its output and input, can provide a phase shift of ninety degrees. In practice, however, at an operating frequency $f_o$, the phase shift is ninety degrees $\mp\Delta\theta$, where $\Delta\theta°$ is the angle (hereinafter called the "phase error") by which the phase shift differs from ninety degrees.

The magnitude of the phase error depends primarily on the amplifier's gain. For a near-infinite-gain amplifier, the phase error is negligible for most high-precision applications. The drawback, however, of using a near-infinite-gain amplifier is that small variations in the DC level in the input stage of the amplifier, or in the input signal itself, become also amplified by the near infinite gain of the amplifier, resulting in instability or "drift" in the DC level of the output signal.

To overcome the tendency of the amplifier to drift in its output DC voltage, a low-valued resistive element may be connected in parallel with the feedback capacitor. As will be shown hereinafter, while the expedient of placing a relatively low-valued resistor in parallel with the feedback capacitor may reduce the tendency of the amplifier to drift, it will also increase the phase error. One might select the largest permissible value for this resistor which will yield satisfactory DC level stability. When this is done, however, one will find that the resulting phase error may be considerably greater than that required for the intended application.

Accordingly, it is the main object of this invention to provide a new and improved phase-shifting circuit for providing a ninety-degree phase shift to an input signal having a frequency which may vary over a relatively wide frequency band, which circuit is sufficiently stable even when operating with a relatively small phase error.

It is another object of this invention to provide a new and improved phase-shifting circuit which is easy to assemble, which employs relatively inexpensive parts, and which operates satisfactorily over a relatively wide frequency range.

These and other objects in accordance with this invention are achieved by connecting across the operational amplifier a feedback circuit comprising at least two substantially identical parallel circuits having a common junction, each circuit including a resistor in parallel with a capacitor, and by connecting the junction terminal to a reference level through a resistive element having a resistance equal to one-half of the value of the resistor in the parallel circuit.

Other objects and advantages of this invention will become apparent from the following description when taken in conjunction with the accompanying drawings in which.

Figure 1:
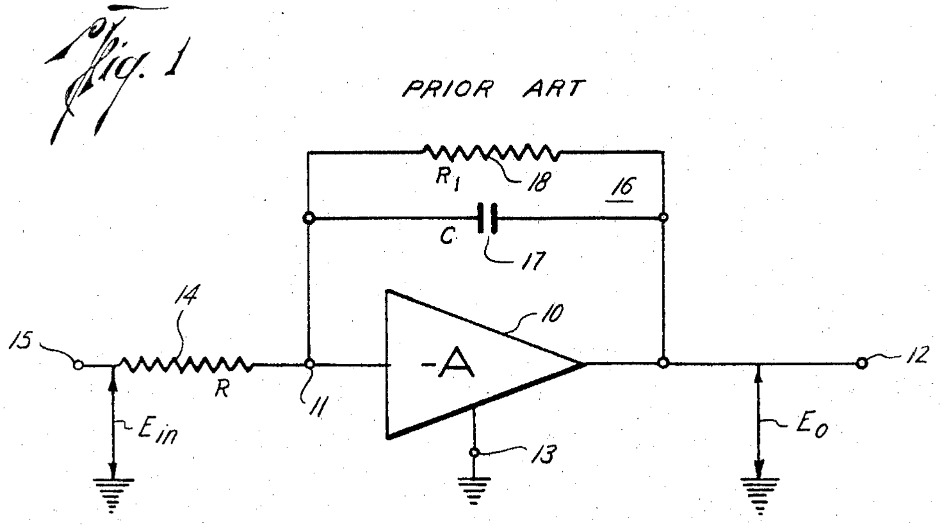
Fig. 1 PRIOR ART
FIGURE 1 is a typical prior art ninety-degree phase-shifting circuit.

In FIGURE 1, there is shown a high-gain, direct-current, operational amplifier 10 having an input terminal 11, an output terminal 12, and a common terminal 13 (shown connected to ground) between its input and output stages. An input resistor 14 having a resistance R is connected between an input terminal 15 and the amplifier's input terminal 11. A negative feedback network 16 is connected between the amplifier's output terminal 12 and input terminal 11. The feedback network 16 comprises a parallel circuit having a capacitor 17 (of capacitance C) and a resistor 18 (of resistance $R_1$). The gain of amplifier 10 is denoted by "—A" in the conventional manner.

Assuming amplifier 10 to have a very high near-infinite gain, then if $R_1$ is very large, the configuration shown in FIGURE 1 will act as a ninety-degree phase shifter with a small phase error $\Delta\theta°$ in a predetermined frequency range. However, as previously mentioned, if $R_1$ is too large, then the phase shifter of FIGURE 1 will be subject to DC output voltage instability. In practice, the values of R, $R_1$ and C are chosen so that at an operating frequency $f_o$, the output signal $E_o$ at terminal 12 is equal in amplitude to the input signal $E_{in}$ at terminal 15, but shifted in phase by ninety degrees plus or minus a phase error of $\Delta\theta°$. It must be remembered, however, that $R_1$ should be relatively small, else the phase shifter may become unstable, that is, slight variations in the input $E_{in}$ will result in relatively large variations in the output $E_o$. For example, if $R_1$ is selected for a phase error of .01°, then the ratio of $R_1/R$ must be on the order of 5700. Since this ratio also represents the DC transfer gain of the phase shifter (from input terminal 15 to output terminal 12), and approximately the amplification factor by which small direct-current and low frequency variations of equivalent amplifier input offset voltage would be reflected to the output terminal 12, it will be readily appreciated that the phase shifter of FIGURE 1 will have an unacceptable output DC level instability under normal operating conditions. Hence, this phase shifter becomes impractical when it is used to provide a ninety degree phase shift with a phase error of only .01°.

Figure 2:
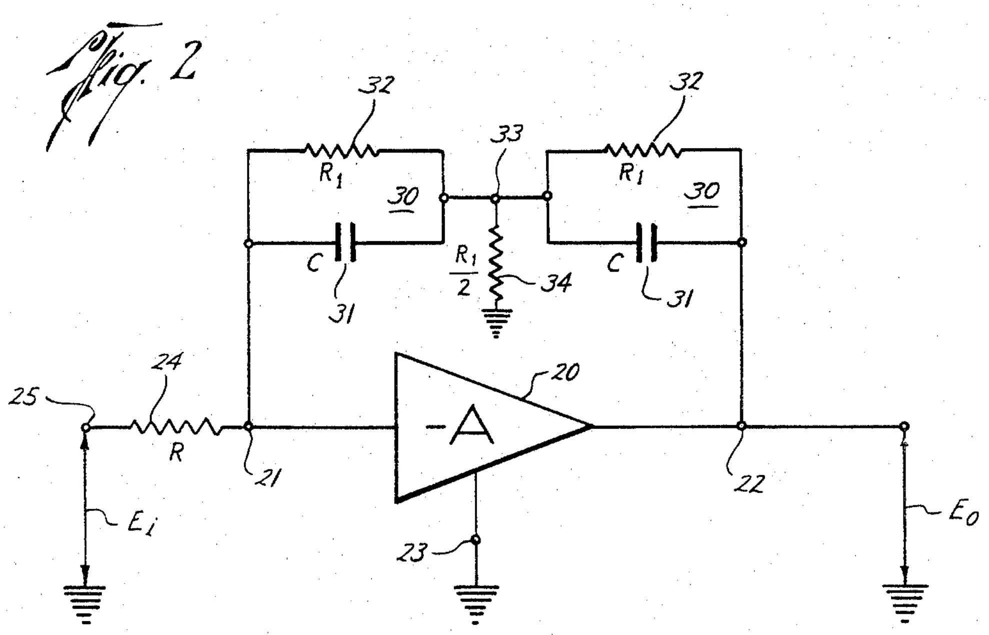
FIGURE 2 is a circuit diagram of the new and improved ninety-degree phase-shifting circuit in accordance with this invention.

In FIGURE 2 is shown a preferred embodiment of a phase-shifting circuit in accordance with this invention. A high-gain, phase-inverting operational amplifier 20 is connected between its input terminal 21 and its output terminal 22. The input and output stages of the amplifier 20 have a common terminal 23 (shown connected to ground). Between the input terminal 25 to the phase-shifting circuit and the amplifier's input terminal 21 is connected a resistor 24 having a resistance R. Between the amplifier's output terminal 22 and input terminal 21 is connected a feedback circuit comprising two series-connected, parallel networks 30 having a common junction 33. Each parallel network includes a capacitor 31 of capacitance C and a resistor 32 of resistance $R_1$. Junction 33 is connected to ground via a resistor 34 having a resistance value equal to one-half of $R_1$.

To make the phase-shifting circuit of FIGURE 2 have unity gain (that is, the output voltage $E_o$ equal in amplitude to the input voltage $E_i$ at an operating frequency $f_o$) and to make $E_o$ have a phase shift with respect to $E_i$ of $90° \mp \Delta\theta$, where the phase error $\Delta\theta$ has a value of .01° (as in the example used above) at $f_o$ (with smaller values of $\Delta\theta$ for any frequency greater than $f_o$), it can be shown taht the ratio $R_1/R$ should be on the order of 11.25 and the capacitance of C should be $11.25/2\pi f_o R_1$.

With these values, the DC and low-frequency transfer gain of the phase-shifting circuit between the input terminal 25 and the output terminal 22 is on the order of 45, and the amplification factor relating equivalent amplifier input DC offset voltage to the output DC offset voltage at terminal 22 is 46. Hence, in accordance with this invention, the DC and low frequency transfer gain and input offset-voltage-amplification factor are lowered by more than one hundred fold (45 as compared to 5700 in the example relating to FIGURE 1). Consequently, the output DC level and low-frequency voltage instability of this phase shifter has been improved by two orders of magnitude as compared to the impractical phase shifter shown in FIGURE 1. The circuit of FIGURE 2, while being relatively stable for most applications, will give a phase error .01° at an operating frequency $f_o$ and a lesser phase error for frequencies above $f_o$ within a relatively large frequency range.

It will be apparent to one skilled in the art that any value may be selected for the ratio $R_1/R$ (for the unity gain condition in which C is also determined); higher values will yield smaller phase errors at the frequency which gives unity transfer gain, but poorer DC and low-frequency, output-voltage stability. Lower values of the ratio $R_1/R$ will produce the opposite effect. It will also be apparent that the value of R may be modified independently of either $R_1$ or C (after they are selected for the unity gain condition) in order to yield transfer gains, higher or smaller than unity at a predetermined operating frequency $f_o$ (with corresponding changes in transfer gain and input offset voltage amplification factor).

While I have illustrated and described the best forms of preferred embodiments of my invention, it will be apparent to those skilled in the art that changes may be made in the form of the apparatus without departing from the spirit of my invention as set forth in the appended claims.

What is claimed is:

1. A circuit for shifting the phase of input signals received at a circuit input terminal by 90 degrees comprising, an amplifier having a high negative gain and respective input and output terminals, the amplifier input terminal being connected to the circuit input terminal to receive the input signals therefrom, a feedback circuit coupling the amplifier output terminal to the amplifier input terminal and comprising first and second series-connected networks, each network including a resistor and a capacitor connected in parallel relationship, the resistance-capacitance product value of one network being substantially equal to the resistance-capacitance product value of the other network, and a resistor connecting a junction common to both networks to a constant level of potential.

2. A circuit as claimed in claim 1, wherein a resistor couples said circuit input terminal to said amplifier input terminal.

3. A circuit for shifting the phase of input signals received at the circuit input terminal by exactly 90 degrees comprising, an amplifier having a high negative gain and respective input and output terminals, the amplifier input terminal being connected to the circuit input terminal to receive the input signals therefrom, a feedback circuit coupling the amplifier output terminal to the amplifier input terminal and comprising first and second series-connected parallel circuits, each parallel circuit including a resistor and a capacitor connected in parallel relationship, the resistors and capacitors comprising the parallel circuits having respective substantially equal values, and a resistor of resistance value substantially equal to one-half the resistance value of one of the resistors comprising one of the parallel circuits and having one end connected to a junction common to both of said parallel circuits and an opposite end at ground potential.

References Cited

UNITED STATES PATENTS

| | | | |
|---|---|---|---|
| 2,749,441 | 6/1956 | Kelly | 330—107 X |
| 3,231,659 | 1/1966 | Mabuchi | 330—107 X |

FOREIGN PATENTS

| | | |
|---|---|---|
| 901,047 | 7/1962 | Great Britain. |

ROY LAKE, *Primary Examiner.*

NATHAN KAUFMAN, *Examiner.*

Disclaimer and Dedication 3,378,785.—*John G. Nordahl*, Lexington, Mass. NINETY-DEGREE AMPLIFIER PHASE SHIFT CIRCUIT. Patent dated Apr. 16, 1968. Disclaimer and dedication filed Mar. 17, 1971, by the assignee, *Weston Instruments, Inc.*

Hereby enters this disclaimer to the remaining term of said patent and dedicates said patent to the Public.

[*Official Gazette April 27, 1971.*]